United States Patent
Nakaji et al.

(10) Patent No.: US 7,910,953 B2
(45) Date of Patent: Mar. 22, 2011

(54) OPTICAL SEMICONDUCTOR DEVICE

(75) Inventors: Masaharu Nakaji, Tokyo (JP); Eitaro Ishimura, Tokyo (JP); Eiji Yagyu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 206 days.

(21) Appl. No.: 12/269,206

(22) Filed: Nov. 12, 2008

(65) Prior Publication Data

US 2009/0294787 A1 Dec. 3, 2009

(30) Foreign Application Priority Data

Jun. 2, 2008 (JP) .................. 2008-144274

(51) Int. Cl.
*H01L 33/00* (2010.01)

(52) U.S. Cl. ........ 257/184; 257/186; 257/189; 257/438; 257/E31.063; 257/E31.116; 257/E29.18

(58) Field of Classification Search .................. 257/184, 257/186, 189, 438, E31.063, E31.116, E29.18
See application file for complete search history.

(56) References Cited

U.S. PATENT DOCUMENTS

| 6,380,531 B1 | 4/2002 | Sugihwo et al. |
| 6,710,367 B1 * | 3/2004 | Bruno et al. .................... 257/17 |
| 2005/0271113 A1 | 12/2005 | Song et al. |
| 2008/0049329 A1 | 2/2008 | Takeuchi |

FOREIGN PATENT DOCUMENTS

| JP | 2003-318485 A | 11/2003 |
| JP | 2005-019599 A | 1/2005 |
| JP | 2005-354061 A | 12/2005 |
| JP | 2008-028421 A | 2/2008 |
| JP | 2008-078615 A | 4/2008 |
| WO | WO 2006/106170 A1 | 10/2006 |

OTHER PUBLICATIONS

E. Ishimura et al., "Record High-Efficient Top Illuminated InGaAs Pin Photodiodes with 20 GHz-Bandwidth", Th.L.3.9 Proc. $21^{st}$ Eur. Conf. On Opt. Comm. (ECOC'95-Brussels, pp. 1079-1082, Date: 1995.

* cited by examiner

*Primary Examiner* — David Vu
*Assistant Examiner* — Suberr Chi
(74) *Attorney, Agent, or Firm* — Leydig, Voit & Mayer, Ltd.

(57) ABSTRACT

An optical semiconductor device includes a distributed Bragg reflection layer of a first conductivity type, a distortion elaxation layer of the first conductivity type, a light absorbing layer, and a semiconductor layer of a second conductivity type, sequentially arranged on a semiconductor substrate. The distortion relaxation layer the same material as the semiconductor substrate. The total optical length of layers between the distributed Bragg reflection layer and the light absorbing layer is an integer multiple of one-half the wavelength of incident light that is detected.

5 Claims, 8 Drawing Sheets

OPTICAL SEMICONDUCTOR DEVICE

BACKGROUND OF THE INVENTION

1. Field of the Invention

The present invention relates to an optical semiconductor device having a distributed Bragg reflecting layer; specifically to an optical semiconductor device with little fluctuation in element properties and high quantum efficiency.

2. Background Art

A photodiode having a distributed Bragg reflector (DBR) layer between a light absorbing layer and a semiconductor substrate has been proposed. Transmitted light not absorbed in the light absorbing layer is reflected by the DBR layer, and is absorbed again in the light absorbing layer. Thereby, high quantum efficiency is obtained in a photodiode having a DBR layer (for example, refer to Japanese Patent Laid-Open No. 2003-318485).

SUMMARY OF THE INVENTION

Each semiconductor layer in a photodiode is epitaxially grown so as to be lattice-matched with a semiconductor substrate at growing temperature. However, since InGaAs or InGaAsP, which is a material for composing the DBR layer, has a different coefficient of thermal expansion from InP, which is a material for composing the semiconductor substrate, distortion is applied to the DBR layer at actual operating temperatures.

Moreover, since the thickness of the DBR layer must be at least 2 μm to obtain high reflectance, an extremely strong distortion is applied to an epitaxial layer grown on the DBR layer. Therefore, since the distortion of the DBR layer is directly applied to the absorbing layer if an absorbing layer is directly grown on the DBR layer, the band structure of the absorbing layer is deformed to significantly affect various property constants, such as increase and decrease in dark current, light absorption coefficients, temperature characteristics, and the effective mass of generated photo-carriers. Also by change in the quantity of distortion applied to a crystal, change in the diffusion rate or diffusion distribution of the dopant during or after wafer processing is observed. Furthermore, in an avalanche photodiode, the abnormality of multiplication factor distribution or local multiplication may occur in the light receiving surface, or edge breakdown may occur. Due to the fluctuation of distortion quantity of DBR layers between chips, a problem of fluctuation in element properties is caused.

Therefore, inventors considered to insert a distortion relaxation layer composed of a same material as the material for the semiconductor substrate between the DBR layer and the light absorbing layer. However, a problem wherein the reflectance of the DBR layer and the quantum efficiency of the optical semiconductor device are lowered by layers formed between the DBR layer and the light absorbing layer was caused.

To solve the above-described problems, an object of the present invention is to provide an optical semiconductor device with little fluctuation in element properties and high quantum efficiency.

According to an optical semiconductor device of the present invention, a distributed Bragg reflection layer of a first conductivity type, a distortion elaxation layer of the first conductivity type, a light absorbing layer, and a semiconductor layer of a second conductivity type are sequentially formed on a semiconductor substrate; said distortion relaxation layer is composed of a same material as the material for said semiconductor substrate; and the total optical length of layers formed between said distributed Bragg reflection layer and said light absorbing layer is the integral multiple of half the wavelength of incident light.

According to the present invention, an optical semiconductor device having little fluctuation in element properties and high quantum efficiency can be obtained.

Other and further objects, features and advantages of the invention will appear more fully from the following description.

DETAILED DESCRIPTION OF THE PREFERRED EMBODIMENTS

First Embodiment

Figure 1:
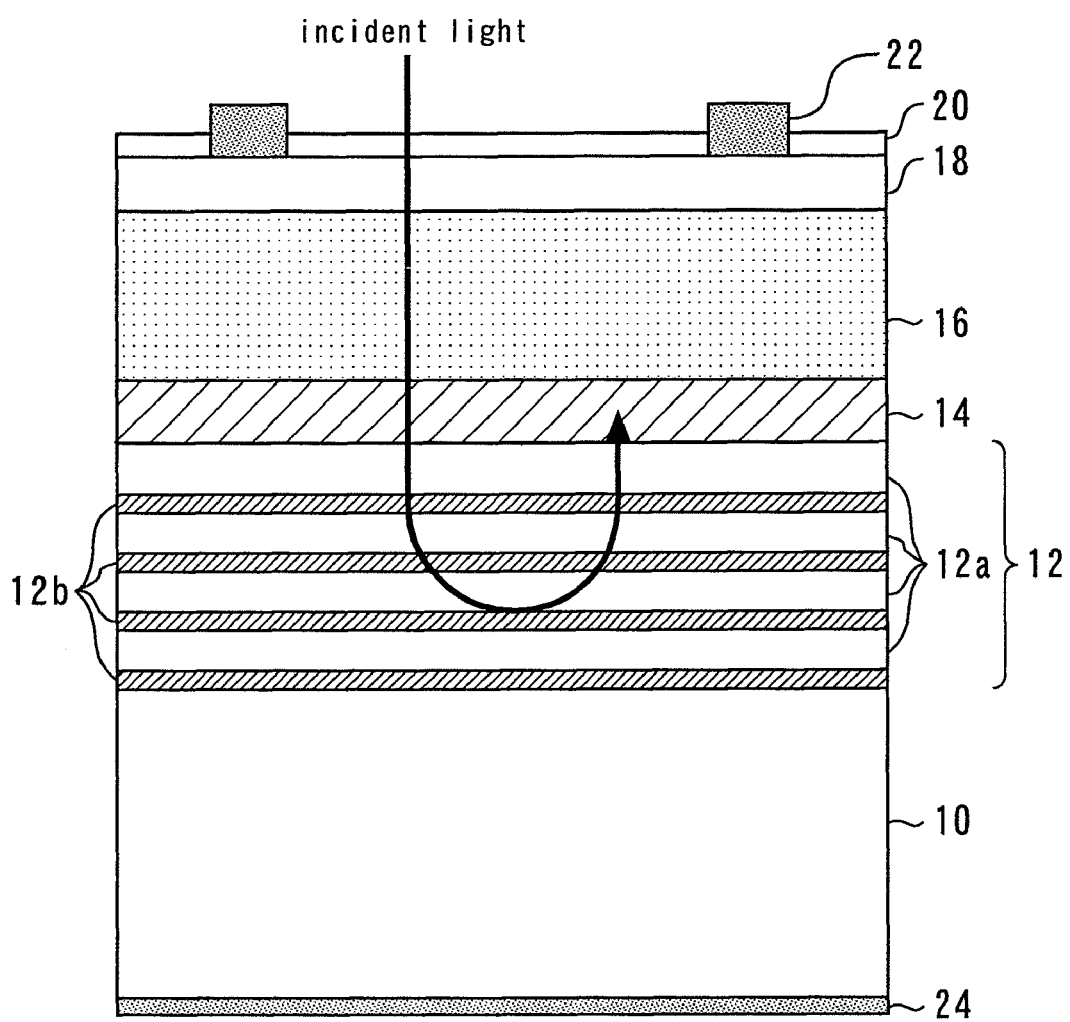
FIG. 1 is a sectional view showing an optical semiconductor device according to the first embodiment of the present invention.

FIG. 1 is a sectional view showing an optical semiconductor device according to the first embodiment of the present invention. The optical semiconductor device is a photodiode having a distributed Bragg reflection layer.

On an n-type InP substrate 10 (semiconductor substrate), an n-type DBR layer 12 (distributed Bragg reflection layer of a first conductivity type), an n-type InP distortion relaxation layer 14 (distortion relaxation layer of a first conductivity type), an i-InGaAs light absorbing layer 16 having a carrier concentration of not more than $5 \times 10^{15}$ cm$^{-3}$ (light absorbing layer), and a p-type InP window layer 18 (semiconductor layer of a second conductivity type) are sequentially formed. On the a p-type InP window layer 18, an insulating film 20 composed of SiN or the like combining a reflection preventing film and a surface protecting film, and an anode (p-type) 22 are formed. On the lower surface of the n-type InP substrate 10, a cathode (n-type) 24 is formed.

The n-type DBR layer 12 is composed of alternately laminated n-type InP layers 12a having a low refractive index and n-type InGaAsP layers 12b having a high refractive index. The optical layer thickness of each of the n-type InP layers 12a and the n-type InGaAsP layers 12b is λ/4 relative to the wavelength λ of incident light, respectively. For example, when λ is 1.55 μm and the refractive index of InP is 3.169, the thickness of each n-type InP layer 100a is 0.123 μm; and when the refractive index of InGaAsP is 3.437, the thickness of each n-type InGaAsP layer 100b is 0.113 μm. The n-type InGaAsP layers 12b may be substituted by n-type InGaAs layers or AlInAs layers. However, each of the n-type InGaAs layers has a band gap wavelength smaller than the wavelength λ of incident light, and absorbs incident light.

In the present embodiment, an n-type InP distortion relaxation layer 14 composed of the same material as the material for the n-type InP substrate 10 is inserted between the n-type DBR layer 12 and the i-InGaAs light absorbing layer 16. The total optical length of layers inserted between the n-type DBR layer 12 and the i-InGaAs light absorbing layer 16 is an integral multiple of half the wavelength λ of incident light.

The operation of the optical semiconductor device according to the present embodiment will be described. A reverse bias of 0.5 to 3 V is applied so that the potential of the anode 22 is lower than the potential of the cathode 24. The incident light enters into the i-InGaAs light absorbing layer 16 from the upper side of FIG. 1 through the insulating film 20 and the p-type InP window layer 18. Then, the incident light is absorbed in the i-InGaAs light absorbing layer 16.

The fraction of the incident light absorbed in the i-InGaAs light absorbing layer 16 (=quantum efficiency) is represented by the following Formula (1):

$$1-\exp(-\alpha \cdot t) \tag{1}$$

where t is the thickness of the i-InGaAs light absorbing layer 16 and α is the absorption coefficient for the incident light of the i-InGaAs light absorbing layer 16.

The light transmitted through the i-InGaAs light absorbing layer 16 without being absorbed in the i-InGaAs light absorbing layer 16 is reflected by the n-type DBR layer 12, and is absorbed again in the i-InGaAs light absorbing layer 16. The quantum efficiency taking return light by n-type DBR layer 12 into account is represented by the following Formula (2):

$$1-\exp(-\alpha \cdot t)+R\cdot\exp(-\alpha \cdot t)\cdot(1-\exp(-\alpha \cdot t)) \tag{2}$$

where R is the reflectance of light in the n-type DBR layer 12.

Difference between the Formulas (1) and (2) is increase in quantum efficiency by the n-type DBR layer 12. The i-InGaAs light absorbing layer 16 is depleted by the reverse bias. An electric field is applied into the depletion layer, electrons and holes flow in the cathode 24 and the anode 22, respectively, and are taken out as an electric current.

Figure 2:
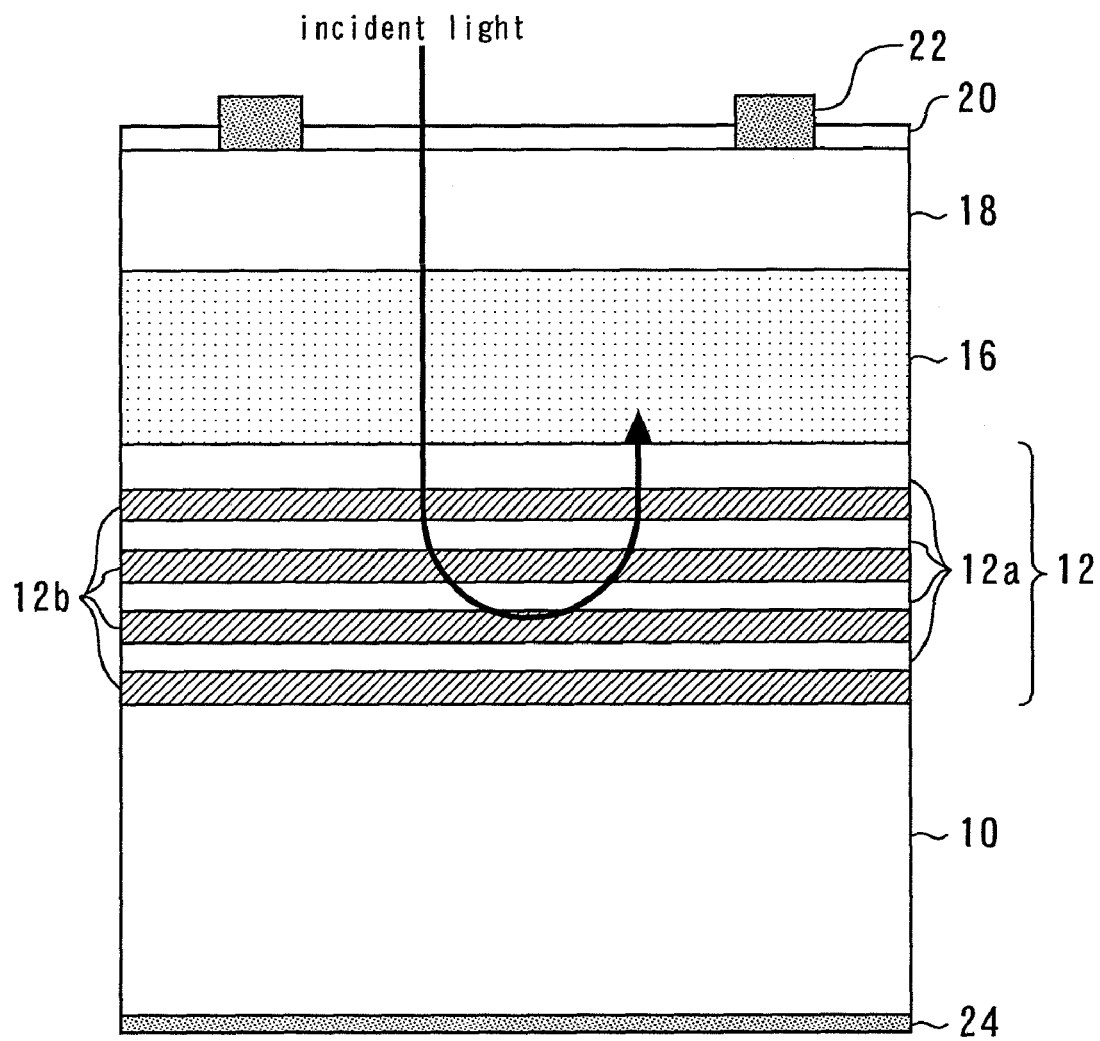
FIG. 2 is a sectional view showing a reference example of an optical semiconductor device.

The effect of the optical semiconductor device according to the present embodiment will be described comparing with a reference example. FIG. 2 is a sectional view showing a reference example of an optical semiconductor device. The optical semiconductor device has no n-type InP distortion relaxation layer 14, an i-InGaAs light absorbing layer 16 is grown so as to be adjacent to an n-type DBR layer 12. Other constituent elements are identical to the constituent elements of the optical semiconductor device according to the present embodiment.

According to the survey of the inventors, although the linear expansion coefficient of InP is $4.56\times10^{-6}$ $K^{-1}$ at room temperature, the linear expansion coefficient of InGaAs is $5.17\times10^{-6}$ $K^{-1}$, and the linear expansion coefficient of InGaAsP is 4.56 to $5.17\times10^{-6}$ $K^{-1}$ depending on the relative proportions of As and P. Since the linear expansion coefficient is a physical quantity related to the interatomic bonding force, bonding length and the like of a crystal, the theoretical estimation of the composition dependence of thermal expansion coefficient in mixed crystals is extremely difficult in the present situation due to the lack of knowledge to be a base of the estimation. However, from certain experimental results, the estimation of the thermal expansion coefficient of mixed crystals on the basis of linear interpolation is considered to be reasonable as a first approximation.

Due to such difference in linear expansion coefficient of InP and InGaAs or InGaAsP, the n-type DBR layer 12 formed on the n-type InP substrate 10 is subjected to a large distortion. In the reference example, the effect of the distortion of the n-type DBR layer 12 is directly received by the i-InGaAs light absorbing layer 16, causing fluctuation in properties between elements.

Whereas in the present embodiment, an n-type InP distortion relaxation layer 14 composed of the same material as the material for the n-type InP substrate 10 is inserted between the n-type DBR layer 12 and the i-InGaAs light absorbing layer 16. Since the distortion of the n-type DBR layer 12 is relaxed by the n-type InP distortion relaxation layer 14, the distortion quantity applied to the i-InGaAs light absorbing layer 16 can be reduced. Thereby, the fluctuation of element properties is reduced.

The total optical length of layers formed between the n-type DBR layer 12 and the i-InGaAs light absorbing layer 16 is the integral multiple of half the wavelength λ of incident light. This prevents the reflectance of the n-type DBR layer 12 from being lowered. Thereby, the quantum efficiency of the optical semiconductor device is high.

The n-type InP distortion relaxation layer 14 can be thinned to 0.1 μm, and can also be a thickness of several micrometers or even more. When the n-type InP distortion relaxation layer 14 is thickened, the distortion of the n-type DBR layer 12 is relaxed, and the i-InGaAs light absorbing layer 16 approaches to the state directly epitaxially grown on the n-type InP substrate 10. However, the light loss or light scattering in the n-type InP distortion relaxation layer 14 may increase, and quantum efficiency may be lowered. Therefore, the thickness of the n-type InP distortion relaxation layer 14 should be decided to satisfy detail condition of applications.

Second Embodiment

Figure 3:
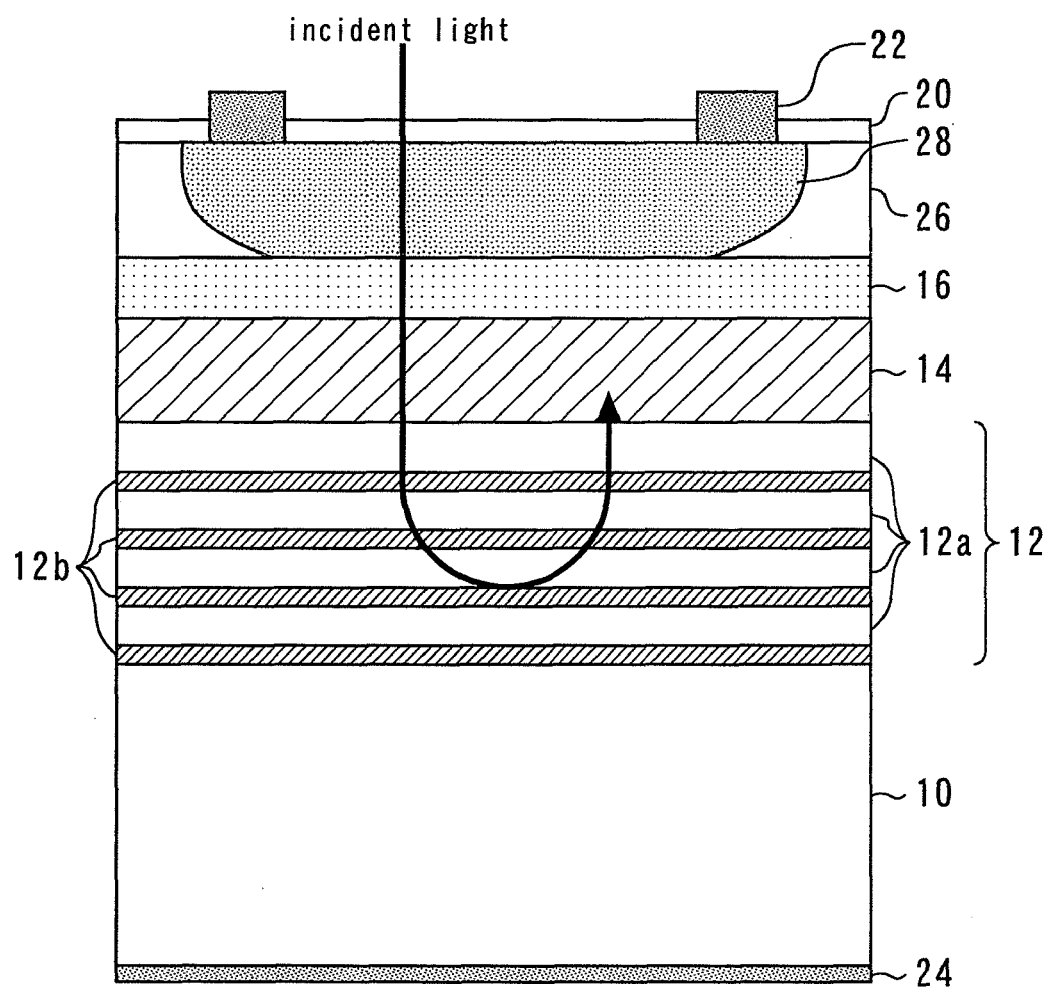
FIG. 3 is a sectional view showing an optical semiconductor device according to the second embodiment of the present invention.

FIG. 3 is a sectional view showing an optical semiconductor device according to the second embodiment of the present invention. The optical semiconductor device is a planar-type pin photodiode in which p-type area is formed using selective diffusion.

An n-type InP layer 26 having a carrier concentration of not more than $1\times10^{16}$ $cm^{-3}$ is formed on an i-InGaAs light absorbing layer 16, and a p-type InP layer 28 (semiconductor layer of a second conductivity type) is formed on a part of the n-type InP layer 26 using selective diffusion and the like. Other constituent elements are identical to the constituent elements of the first embodiment. Thereby the same effect as the effect of the first embodiment can be obtained.

Third Embodiment

Figure 4:
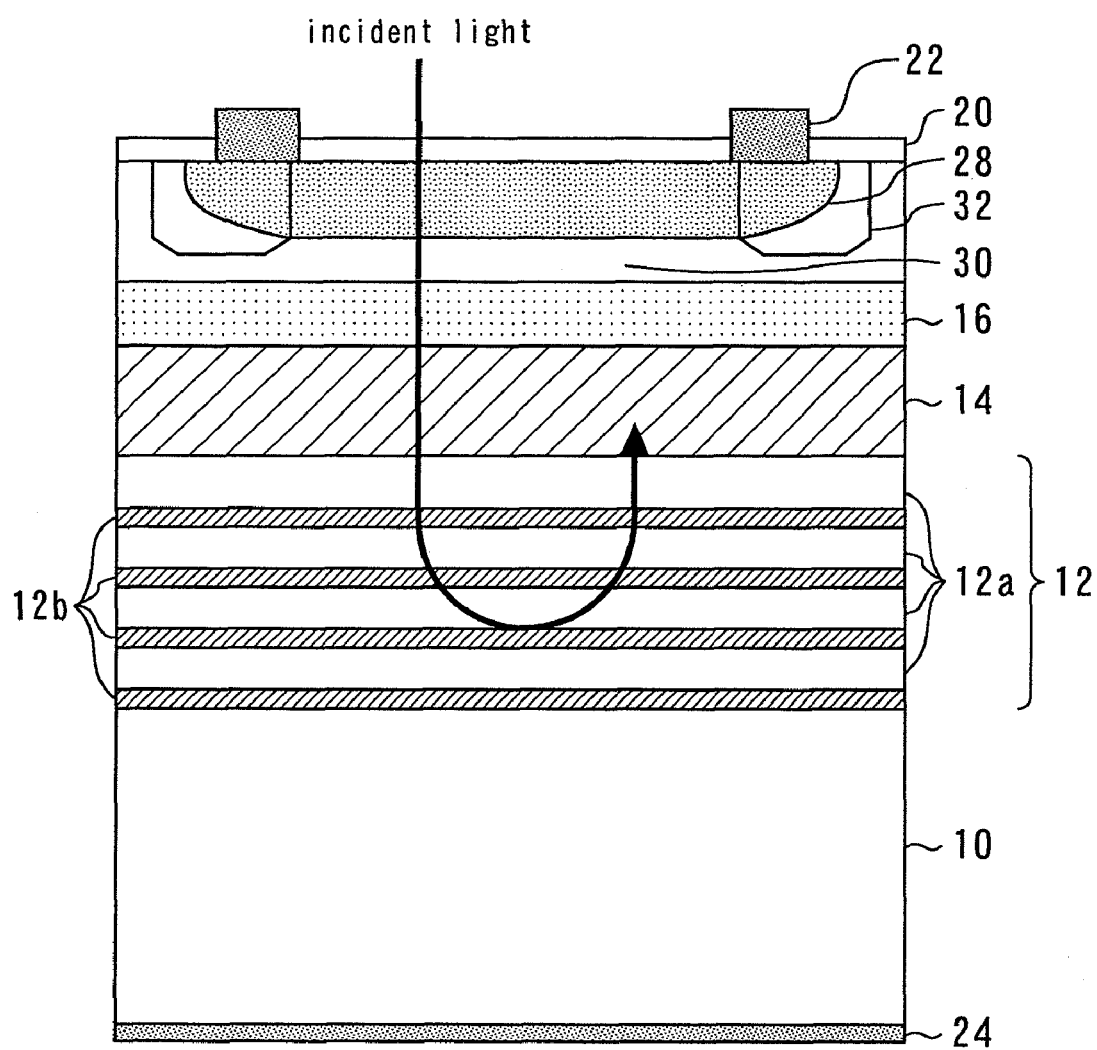
FIG. 4 is a sectional view showing an optical semiconductor device according to the third embodiment of the present invention.

FIG. 4 is a sectional view showing an optical semiconductor device according to the third embodiment of the present invention. The optical semiconductor device is a planar-type InP avalanche photodiode.

An n-type InP multiplication layer 30 (carrier multiplication layer) is formed on an i-InGaAs light absorbing layer 16, and a p-type InP layer 28 (semiconductor layer of a second conductivity type) is formed on a part of the n-type InP layer 30 using selective diffusion and the like. A guard ring 32 is formed around the p-type InP layer 28 using Be ion implantation and the like. The n-type InP multiplication layer 30 avalanche-multiplies light carriers generated in an i-InGaAs light absorbing layer 16. Other constituent elements are identical to the constituent elements of the first embodiment.

The p-type InP layer 28 is formed so as to contact the n-type InP multiplication layer 30. The p-type InP layer 28 is formed using heat diffusion during wafer processing. The thickness of the n-type InP multiplication layer 30 is controlled to nanometer order by controlling the diffusion depth of the p-type dopant. Therefore, since multiplication characteristics are significantly varied when the diffusion rate of the dopant or the diffusion distribution of the dopant is varied by the influence of lattice distortion, the effect of reducing fluctuation of element properties by the insertion of the n-type InP distortion relaxation layer 14 is extremely large.

Fourth Embodiment

Figure 5:
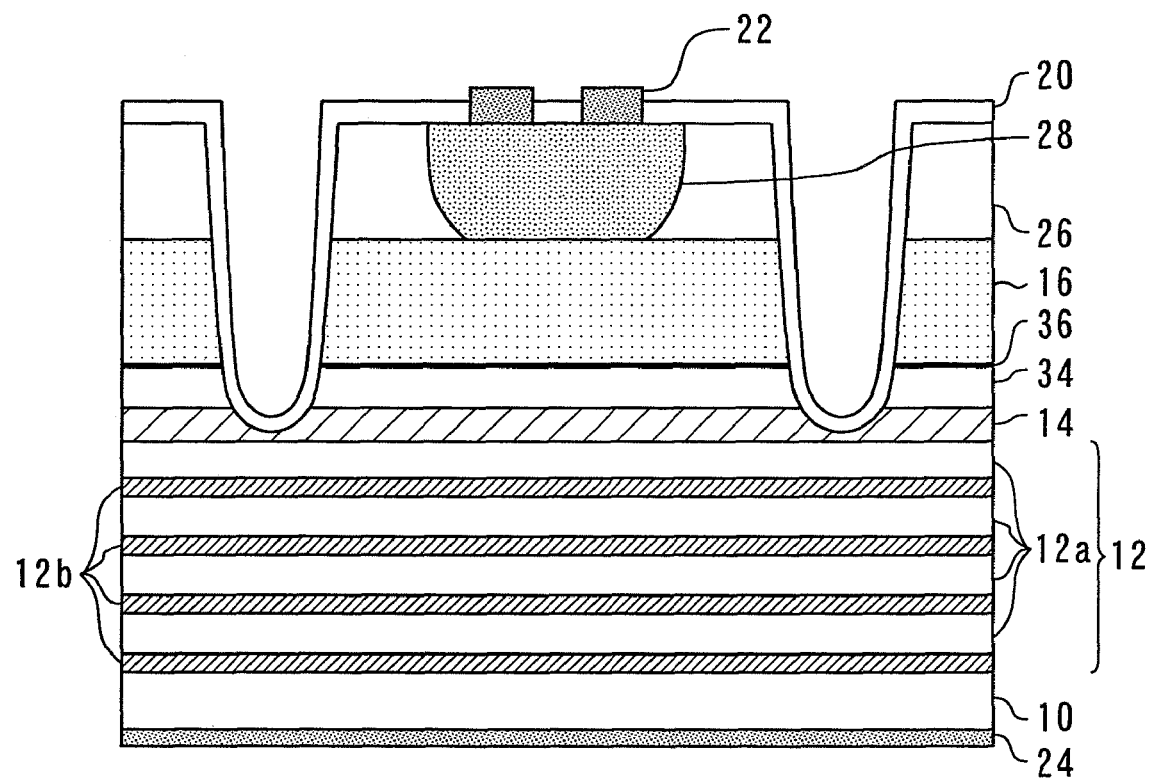
FIG. 5 is a sectional view showing an optical semiconductor device according to the fourth embodiment of the present invention.

FIG. 5 is a sectional view showing an optical semiconductor device according to the fourth embodiment of the present invention. The optical semiconductor device is a planar-type AlInAs avalanche photodiode.

An n-type AlInAs multiplication layer 34 (carrier multiplication layer) and an electric-field relaxing layer 36 are formed between an n-type DBR layer 12 and an i-InGaAs light absorbing layer 16. The n-type AlInAs multiplication layer 34 avalanche-multiplies light carriers generated in an i-InGaAs light absorbing layer 16. Other constituent elements are identical to the constituent elements of the second embodiment. Thereby, the effect equivalent to the effects of the first and second embodiments can be obtained.

Fifth Embodiment

Figure 6:
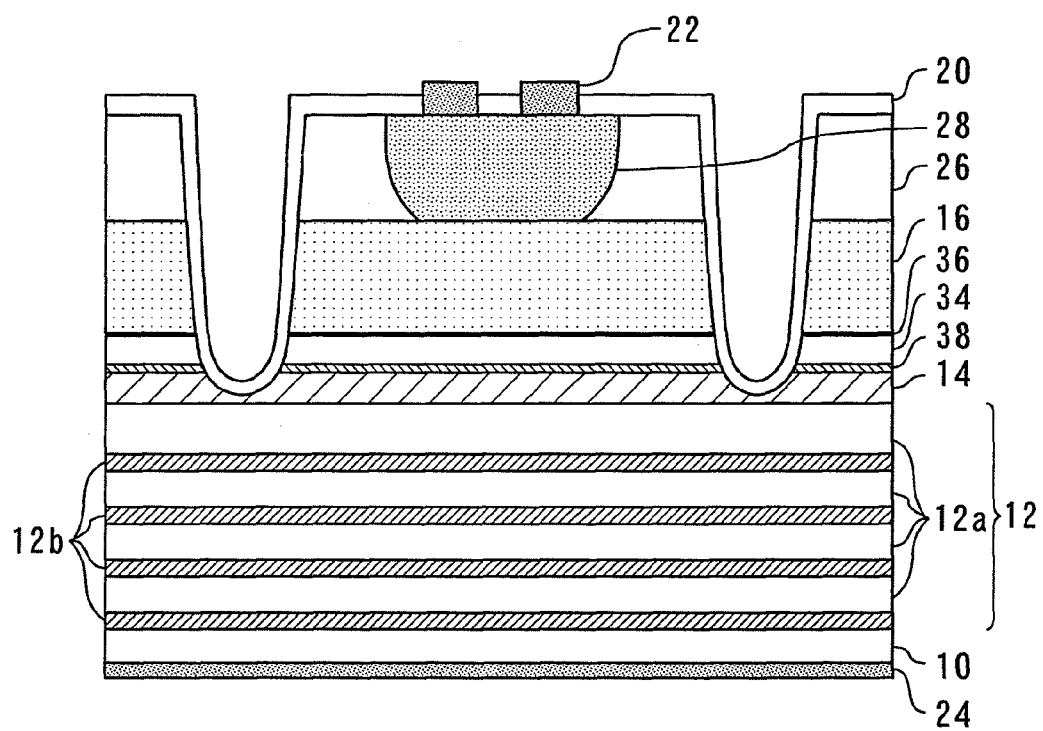
FIG. 6 is a sectional view showing an optical semiconductor device according to the fifth embodiment of the present invention.

FIG. 6 is a sectional view showing an optical semiconductor device according to the fifth embodiment of the present invention. The semiconductor device is a planar-type AlInAs avalanche photodiode as in the fourth embodiment.

An n-type AlInAs layer 38 having a high carrier concentration is inserted between an n-type InP distortion relaxation layer 14 and an n-type AlInAs multiplication layer 34. Other constituent elements are identical to the constituent elements of the fourth embodiment. Thereby, since the electric field of the n-type AlInAs multiplication layer 34 is not applied to the n-type InP layers 12a of the n-type DBR layer 12, the multiplication of holes in the n-type InP layers 12a is suppressed, and a low-noise avalanche photodiode can be achieved.

Sixth Embodiment

Figure 7:
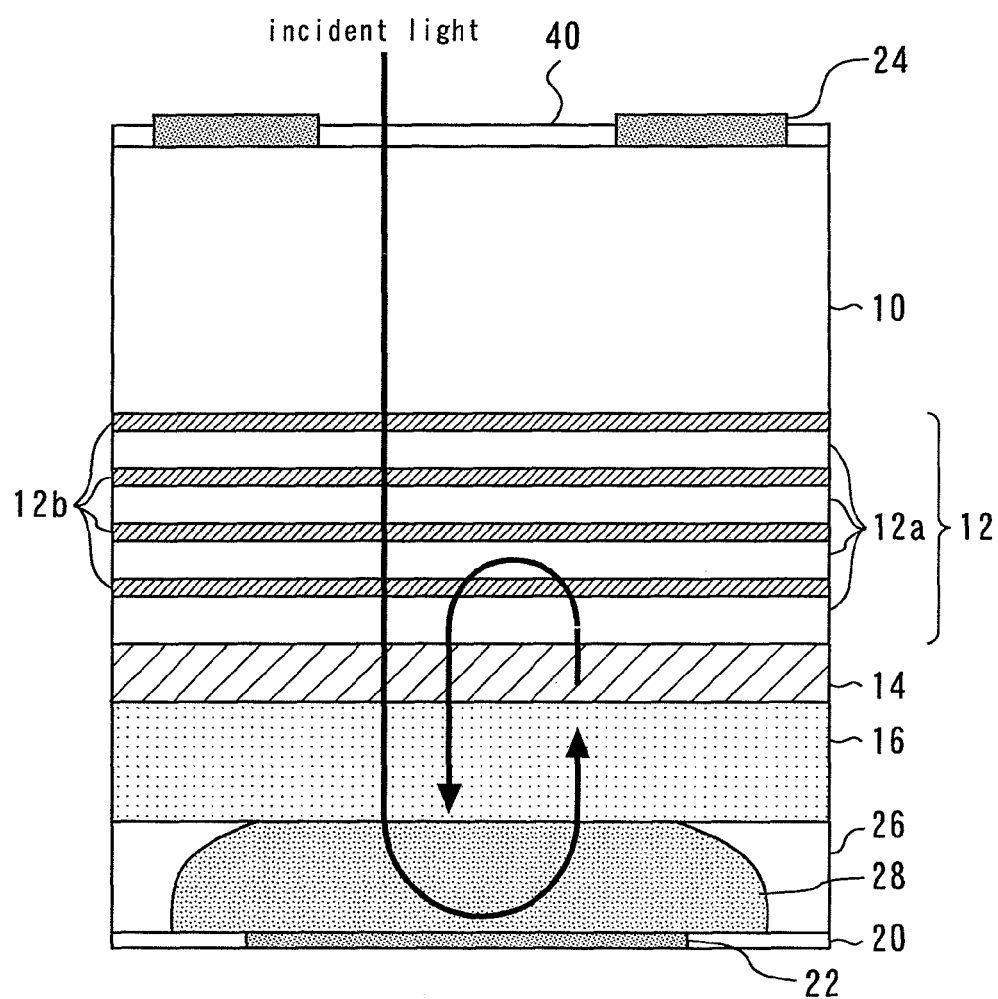
FIG. 7 is a sectional view showing an optical semiconductor device according to the sixth embodiment of the present invention.

FIG. 7 is a sectional view showing an optical semiconductor device according to the sixth embodiment of the present invention. The semiconductor device is a lower-surface incident surface emitting laser that receives light from the substrate side.

A reflection preventing film 40 is formed on the lower surface of an n-type InP substrate 10, and light enters from the lower surface side of the n-type InP substrate 10. Other constituent elements are identical to the constituent elements of the second embodiment. Thereby, the effect equivalent to the effects of the first and second embodiments can be obtained.

Seventh Embodiment

Figure 8:
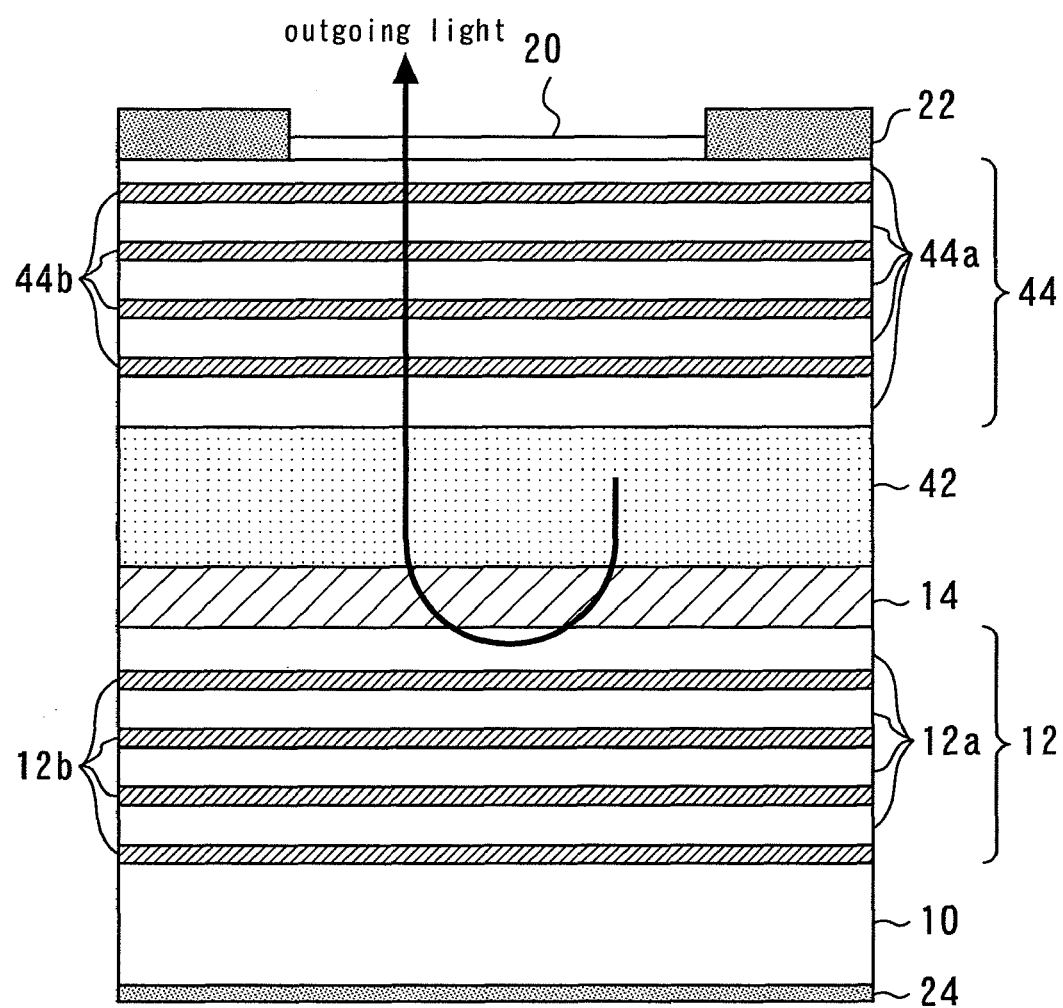
FIG. 8 is a sectional view showing an optical semiconductor device according to the seventh embodiment of the present invention.

FIG. 8 is a sectional view showing an optical semiconductor device according to the seventh embodiment of the present invention. The semiconductor device is a surface emitting laser.

On an n-type InP substrate 10 (semiconductor substrate), an n-type DBR layer 12 (distributed Bragg reflection layer of a first conductivity type), an n-type InP distortion relaxation layer 14 (distortion relaxation layer of the first conductivity type), an i-InGaAs active layer 42 having a carrier concentration of not more than $5 \times 10^{15}$ cm$^{-3}$ (active layer), and a p-type DBR layer 44 (distributed Bragg reflection layer of a second conductivity type) are sequentially formed. On the a p-type DBR layer 44, an insulating film 20 composed of SiN or the like combining a reflection preventing film and a surface protecting layer, and an anode (p-type) 22 are formed. On the lower surface of the n-type InP substrate 10, a cathode (n-type) 24 is formed.

The n-type DBR layer 12 is composed of alternately laminated n-type InP layers 12a and n-type InGaAsP layers 12b. The p-type DBR layer 44 is composed of alternately laminated p-type InP layers 44a and p-type InGaAsP layer 44b.

When the i-InGaAs active layer 42 is sandwiched by DBR layers, the light shuffles between the upper and lower DBR layers to generate laser oscillation.

In the present embodiment, the n-type InP distortion relaxation layer 14 composed of the same material as the material for the n-type InP substrate 10 is inserted between the n-type DBR layer 12 and the i-InGaAs active layer 42. Since the distortion of the n-type DBR layer 12 is relaxed by the n-type InP distortion relaxation layer 14, the distortion quantity applied to the i-InGaAs active layer 42 can be reduced. Thereby, the fluctuation of element properties is reduced.

The total optical length of layers formed between the n-type DBR layer 12 and the i-InGaAs active layer 42 is the integral multiple of half the wavelength λ of incident light. This prevents the reflectance of the n-type DBR layer 12 from being lowered. Thereby, the quantum efficiency of the optical semiconductor device is high.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-144274, filed on Jun. 2, 2008 including specification, claims, drawings and summary, on which the Convention priority of the present application is based, are incorporated herein by reference in its entirety.

What is claimed is:

1. An optical semiconductor device detecting incident light having a wavelength λ, said optical semiconductor device including:
   a semiconductor substrate; and
   a distributed Bragg reflection layer structure of a first conductivity type, a distortion relaxation layer of the first conductivity type, a light absorbing layer, and a semiconductor layer of a second conductivity type, sequentially arranged on said semiconductor substrate, wherein
      said distortion relaxation layer and said semiconductor substrate are composed of the same material, and
      total optical length between said distributed Bragg reflection layer structure and said light absorbing layer is an integer multiple of one-half of the wavelength λ of the incident light that is detected.

2. The optical semiconductor device according to claim 1, wherein
   said semiconductor substrate and said distortion relaxation layer are InP, and
   said distributed Bragg reflection layer structure comprises one of InGaAs layers, InGaAsP layers, and AlInAs layers.

3. The optical semiconductor device according to claim 1, wherein said semiconductor layer of the second conductivity type and said semiconductor substrate are the same material.

4. The optical semiconductor device according to claim 1, including a carrier multiplication layer for avalanche multiplication of photocarriers generated in said light absorbing layer, said carrier multiplication layer being located between said light absorbing layer and said semiconductor layer of the second conductivity type.

5. The optical semiconductor device according to claim 1, including a carrier multiplication layer for avalanche multiplication of photocarriers generated in said light absorbing layer, said carrier multiplication layer being located between said distributed Bragg reflection layer structure and said light absorbing layer.

* * * * *